United States Patent [19]

Badger

[11] Patent Number: 5,678,211
[45] Date of Patent: Oct. 14, 1997

[54] TELEVISION TUNING APPARATUS

[75] Inventor: David Mark Badger, Indianapolis, Ind.

[73] Assignee: Thomson Consumer Electronics, Inc., Indianapolis, Ind.

[21] Appl. No.: 558,761

[22] Filed: Nov. 16, 1995

Related U.S. Application Data

[63] Continuation of Ser. No. 204,249, Mar. 7, 1994, abandoned.

[30] Foreign Application Priority Data

Aug. 28, 1992 [GB] United Kingdom ............ 9218373

[51] Int. Cl.$^6$ ........................................ H04B 1/16
[52] U.S. Cl. ........................ 455/191.1; 455/193.3; 455/197.2; 341/152
[58] Field of Search ...................... 455/178.1, 180.3, 455/180.4, 191.1, 191.2, 195.1, 186.1, 196.1, 197.2, 260, 265, 338, 340, 339, 266, 290, 197.1, 193.1, 193.3, 193.2, 280, 164.1, 182.1, 192.1, 192.2, 197.3; 341/144, 152; 348/731, 732, 733

[56] References Cited

U.S. PATENT DOCUMENTS

| | | | |
|---|---|---|---|
| 4,334,323 | 6/1982 | Moore | 455/179 |
| 4,364,026 | 12/1982 | Steckler et al. | 341/152 |
| 4,402,089 | 8/1983 | Knight et al. | 455/340 |
| 4,472,685 | 9/1984 | Dutasta | 455/340 |
| 4,595,910 | 6/1986 | Wine | 341/152 |
| 4,685,150 | 8/1987 | Maier | 455/340 |
| 4,736,456 | 4/1988 | Maier | 455/191.1 |
| 5,059,979 | 10/1991 | Micic et al. | 341/152 |
| 5,263,187 | 11/1993 | Sugawa et al. | 455/340 |
| 5,280,638 | 1/1994 | Porambo et al. | 455/340 |

FOREIGN PATENT DOCUMENTS 0298625  1/1989  European Pat. Off. .

OTHER PUBLICATIONS

Patent Abstracts of Japan, vol. 10, No. 39, 15 Feb., 1986 and Japanese Pat. 60-194818 (Onkyo K.K.), 3 Oct., 1985.

*Primary Examiner*—Andrew Faile
*Assistant Examiner*—Nguyen Vo
*Attorney, Agent, or Firm*—Joseph S. Tripoli; Peter M. Emanuel; Frederick A. Wein

[57] ABSTRACT

The invention concerns an arrangement including a microprocessor controller, PROM memory, and a digital to analog converter (DAC) arrangement for generating a plurality of control voltages for trimming respective ones of a plurality of varactor controlled tunable filters. The controller couples digital control signals to the respective DACs which generate respective analog control voltages which are applied to the respective tunable filters. A tuning voltage generated by a closed control loop, such as phased locked loop also under the control of the controller, is combined with the output control voltages generated by the respective DAC's in a resistance divider arrangement.

5 Claims, 4 Drawing Sheets

5,678,211

1

TELEVISION TUNING APPARATUS

This is a continuation of application Ser. No. 08/204,249, filed Mar. 7, 1994, now abandoned.

BACKGROUND

The present invention pertains to the frequency alignment of a plurality of tunable filters of a tuner which have a tuning frequency responses which are determined by the magnitudes of respective control signals.

Tunable filters responsive to the magnitude of a control signal, e.g., a tuning voltage, are employed to select one RF carrier from a plurality of received RF carriers, and for generating a local oscillator (LO) signal having the appropriate frequency for heterodyning the selected RF carrier to produce the IF signal. When the passband of the RF filters do not properly track with each other and the frequency of the local oscillator signal, the desired resultant IF signal may be degraded and the possibility of crosstalk from adjacent TV channels is increased.

Tunable filters usually include a voltage controlled capacitance (varactor) diode as a frequency control element because a varactor diode exhibits a capacitance vs. voltage characteristic when they are reverse biased.

Owing to the normal tolerances of components employed in tuning systems and to normal production variations, it is necessary that the tunable filters in the RF tuner be initially adjusted in production. This is because the varactor diodes in the RF filters and local oscillator circuits do not have precisely the same capacitance characteristics over the voltage range corresponding to the tuning band of frequencies. This initial adjustment typically involves mechanically "trimming" inductive and capacitive elements so that the frequency responses of the various tuned circuits are aligned and track one another throughout one or more frequency bands. However, these alignment adjustments are often time-consuming, sometimes requiring an iterative alignment procedure.

SUMMARY OF THE INVENTION

The invention concerns an arrangement including a microprocessor controller, PROM memory, and a digital to analog converter (DAC) arrangement for generating a plurality of control voltages for trimming respective ones of a plurality of varactor controlled tunable filters. The controller couples digital control signals to the respective DACs which generate respective analog control voltages which are applied to the respective tunable filters. A tuning voltage generated by a closed control loop, such as phased locked loop also under the control of the controller, is combined with the output control voltages generated by the respective DAC's in a resistance divider arrangement.

2

DETAILED DESCRIPTION OF THE PREFERRED EMBODIMENT

Figure 1:
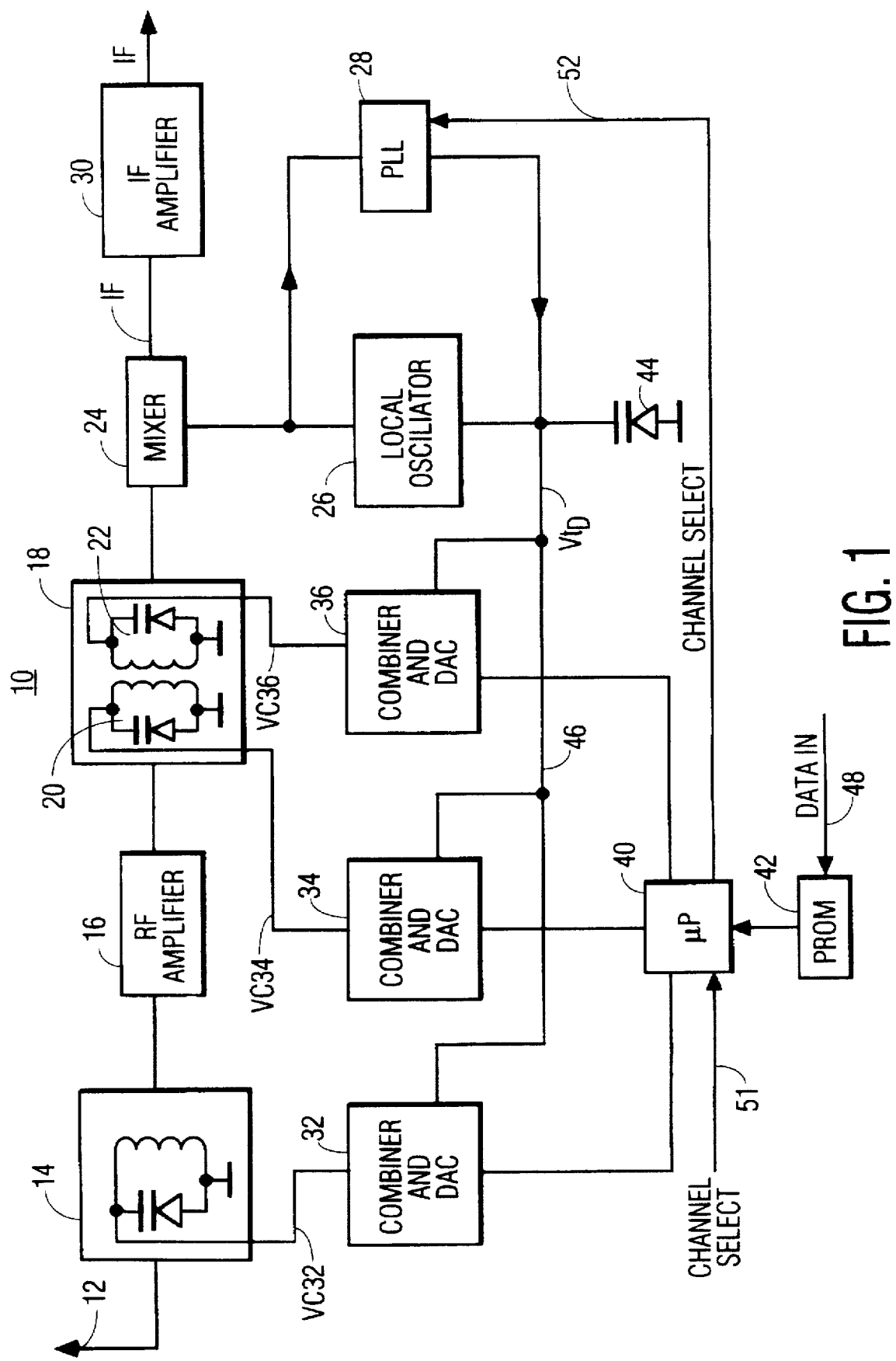
FIG. 1 is a block diagram of a tuner of a television system which may utilize an arrangement constructed according to aspects of the present invention.

FIG. 1, shows a tuner section 10 of a television apparatus and includes an input 12 for receiving television RF carriers provided by an antenna, cable system, or other input device, such as a VCR. The received RF signals are filtered by an input RF filter 14 to attenuate undesired signals. The output signals of filter 14 are amplified by RF amplifier 16. The output signals of amplifier 16 are coupled to a double tuned RF output filter 18 which includes two tunable circuits 20 and 22. The RF signals from circuit 22 are coupled to mixer 24 and are heterodyned with the output signal of a local oscillator 26 which has its frequency controlled by phase locked loop (PLL) 28 in response to a tuning voltage Vto. The output of mixer 24 is an IF signal which is amplified and filtered by IF amplifier 30.

Tunable filters 14, 20, 22 each include a tuned circuit comprising an inductor and a varactor diode connected in parallel combination. The varactor diodes of tuning filters 14, 20 and 22 receive respective tuning voltages Vc32, Vc34 and Vc36.

Tuning voltages Vc14, Vc20 and Vc22 for tuned circuits 14, 20, and 22 are generated by a respective DAC and combiner units 32, 34, and 36 in response to digital signals fed from microprocessor (uP) 40 and the tuning voltage Vto of PLL 28. When a channel is selected, microprocessor 40 generates digital trimming or adjustment control signals which are determined from data stored in PROM 42 and which are coupled to addressable DAC's 32, 34, and 36. Microprocessor controller 40 also provides the appropriate division factor (usually referred to as "N") in digital form to PLL 28. In response to the digital division factor, N, PLL 28 generates an analog tuning voltage Vto to adjust the frequency of local oscillator 26 by changing the capacitance of a varactor diode 44 associated with local oscillator 26. Tuning voltage Vto is also coupled via line 46 to DAC and combining units 32, 34, and 36.

In production at the factory, the optimum trimming voltages provided by respective DACs of units 32, 34, and 36 for tuning the varactor diodes of tuning circuits 14, 20, 22 are determined. The tuning voltages Vc14, Vc20 and Vc22 for tunable circuits 14, 20 and 22 respectively are a combination of the analog voltage corresponding to the digital trimming controls signal received from PROM 42 via microprocessor 40 and tuning voltage Vto received on line 46 from PLL 28, as will be discussed more fully below.

During production, the digital trimming control signals to be provided by microprocessor 40 for optimal tuning of tuning circuits 14, 20, and 22 are received via bus line 48 and written into PROM 42. At a later time, when a viewer enters a channel select signal via bus line 51, a digital channel select signal is passed to PLL 28 via line 52 and the digital trimming control data is read from PROM 42.

Figure 2:
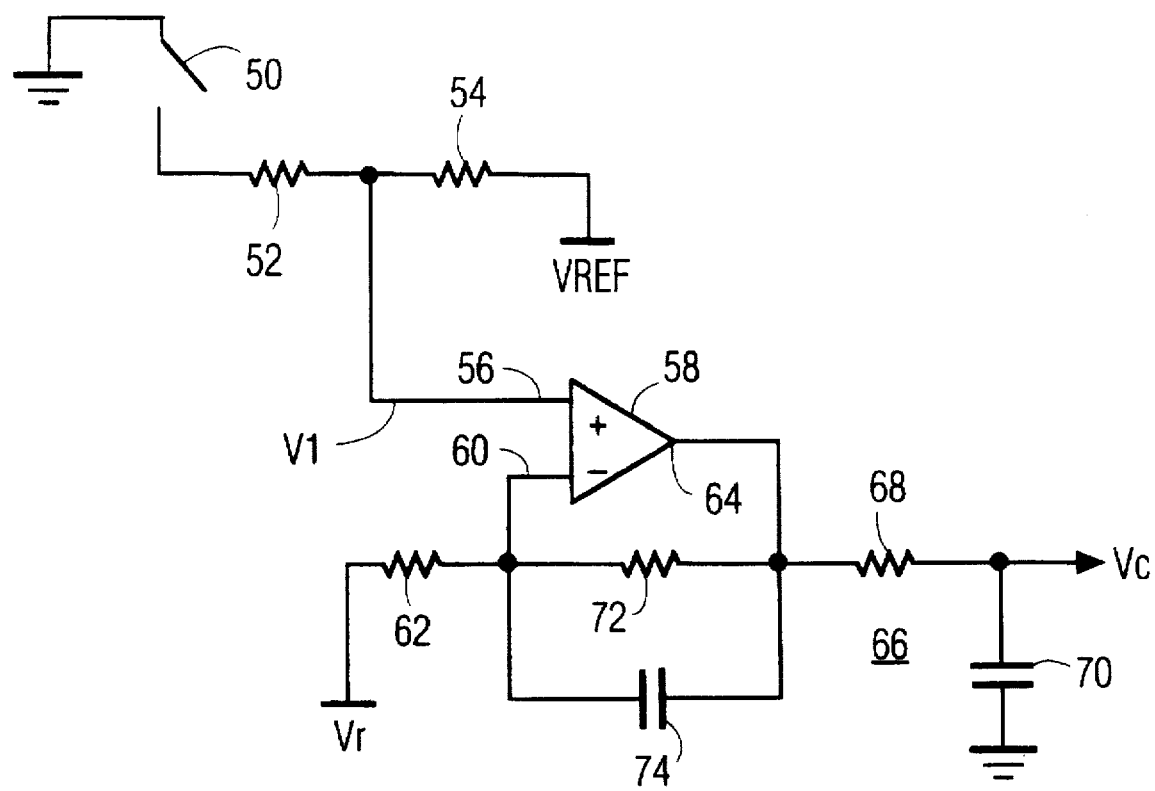
FIG. 2 is a schematic of an arrangement constructed according to the present invention which may be employed in the television system shown in FIG. 1.

Referring now to FIG. 2, there is shown the DAC and combining circuitry within each of units 32, 34, and 36 shown in block form in FIG. 1. The output signal of microprocessor 40 corresponding to the digital trimming data stored in PROM 42 is a pulse width modulated (PWM) pulse signal. The PWM signal controls electronic switch 50. Switch 50 is coupled between one end of a voltage divider comprising resistors 52 and 54 and signal ground. The other end of the voltage divider receives a reference voltage Vref. Reference voltage Vref is the combination of a divided down version of PLL tuning voltage Vto and a constant voltage Vo according to the equation Vref=kVto+Vo (see FIG. 3). A voltage V1 developed at the junction of resistors 54 and 52 is fed to non-inverting input 56 of operational amplifier (op amp) 58. A voltage Vr is fed to inverting input 60 through resistor 62. Voltage Vr provides an adjustable "offset" voltage for centering the output tuning voltage Vc within the adjustment tuning range for the particular band of frequencies which are being tuned. Output terminal 64 is coupled to output filter 66 comprising resistor 68 and capacitor 70, with feedback being provided from terminal 64 to terminal 60 by resistor 72 and capacitor 74.

Figure 3:
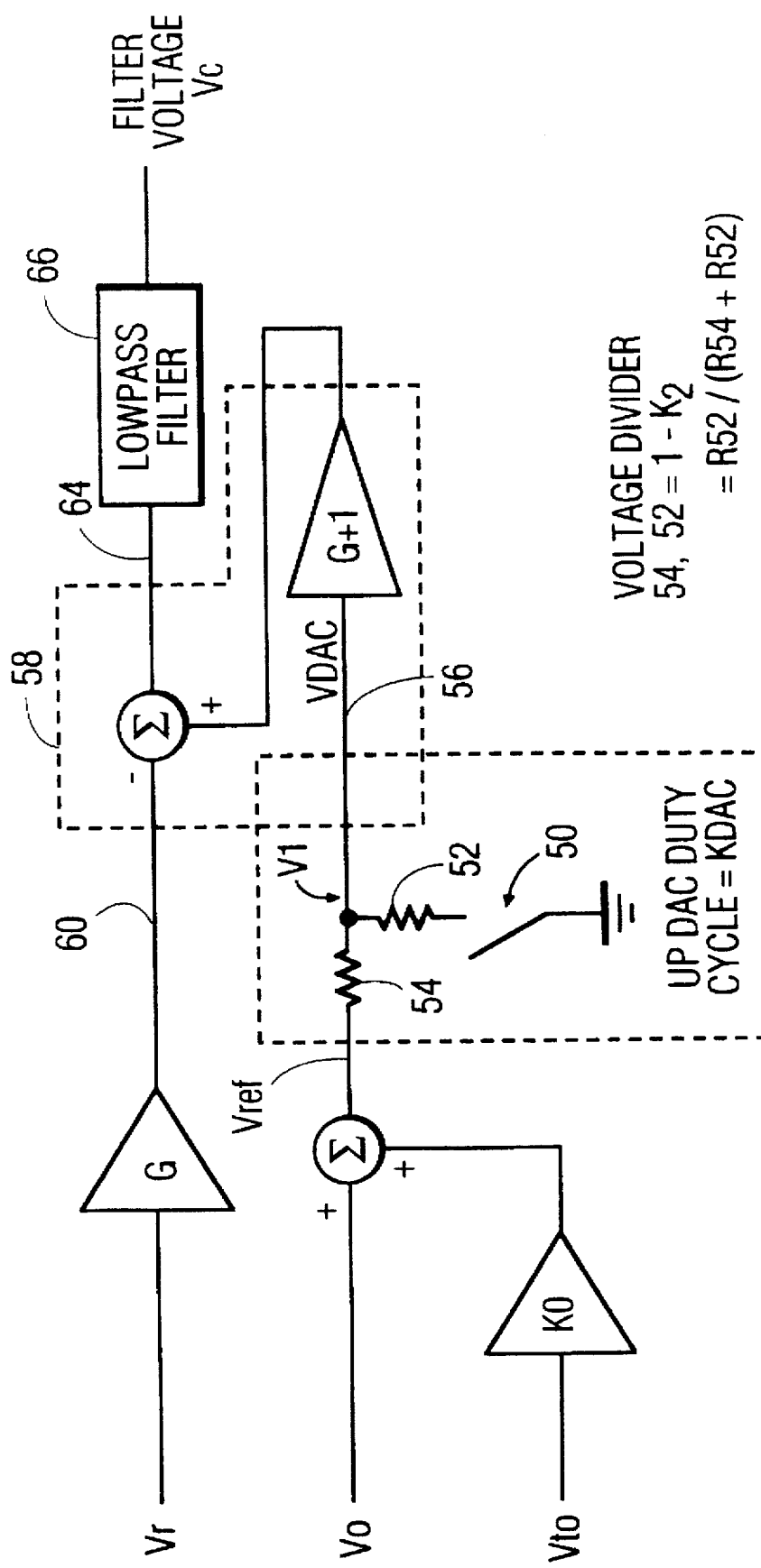
FIG. 3 is an block diagram representation of the arrangement shown in FIG. 2.

A block diagram version of the circuit shown in FIG. 2 is shown in FIG. 3, wherein like members have like designations. FIG. 3 shows the combination of a version of voltage Vto (amplified by a factor Ko) and constant voltage Vo to form Vref. Voltage V1 is combined with a version of voltage Vr amplified by a factor G to produce an output signal at line 64. The later signal is lowpass filtered by low pass filter 66 to produce tuning voltage Vc.

Mathematically, the control voltage can be expressed as;

$$Vc=(KoVto+Vo)(1-K2Kdac)(G+1)-GVr$$

if $GKo=1$, $Vr=Vo$, and $K2(G+1)=2$, the above equation simplifies to:

$$Vc=Vto+KoVto+Vo-2Kdac(KoVto+Vo).$$

If $Ko=0.16$ and $Vo=1$, then $\pm 1$ volt for $Vc=0$, and $\pm 5$ volts for $Vc=25$.

Figure 4:
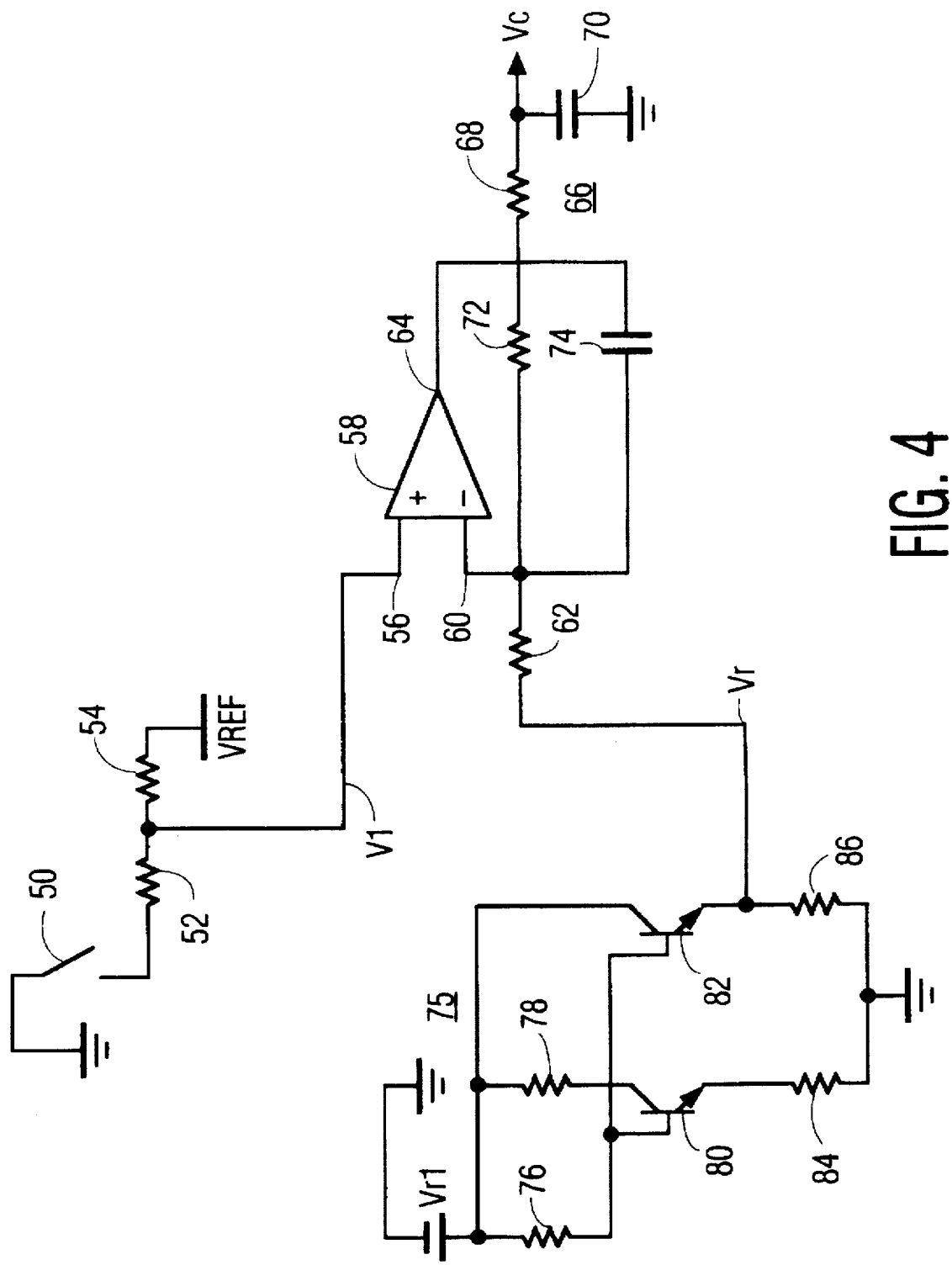
FIG. 4 is a schematic diagram of a modification of the arrangement shown in FIG. 2 including a temperature compensation circuit.

FIG. 4 shows a temperature compensation circuit 75 for temperature compensating the circuit of FIG. 2. Temperature compensation circuit 75 is substituted for the source of "offset" voltage Vr of the arrangement shown in FIG. 2. The bases of each of transistors 80, 82 are coupled to a source of voltage Vr1 through resistor 76, with the collector of transistor 80 being coupled to Vr1 through resistor 78 and the collector of transistor 82 being coupled directly to source of voltage Vr1. The emitters of transistors 80 and 82 are respectively coupled to ground through resistors 84 and 86 with output voltage Vr being taken across resistor 86. A temperature compensated version of Vr is provided by transistor 82. The base-to-emitter voltage change of transistor 82 with changes of temperature are tracked by the base-emitter voltage change of transistor 80.

The application of Vto from the PLL reduces the number of channels requiring alignment and therefore the total amount of data requiring storage in the PROM. If the tuning voltage (Vc) for the tunable filters 14, 20, and 22 were responsive only to the DACs, not only would the DACs need to be high resolution DACs, but each channel would require alignment data. However, with the tuning voltage Vc being responsive to Vto, the tuning voltage Vc will change with channel even for the same DAC output. This first approximation provided by the application of Vto is sufficient for alignment over a small range of channels, thus reducing the number of channels requiring unique data. Both the reduced range of the DAC and the fewer number of channels requiring unique alignment data means that much less data needs to be stored in the PROM with a subsequent savings of cost of the PROM.

The voltage divider of resistors 52, 54 maintains the first approximation offered by the application of Vto. If the divider were not present (resistor 52 being replaced by a short circuit wire), the voltage V1 at 56, and consequently the tuning voltage Vc, would be zero for a DAC setting of zero. Thus, for channels requiring a large Vto, the adjustment range of Vc afforded by the DAC would also be large (zero volts to more than Vto) and the DAC resolution would have to be larger. The inclusion of the resistive voltage divider 52, 54 prevents the tuning voltage Vc from reaching below a predetermined minimum when the DAC output voltage is zero volts and Vto is large.

With the proper selection of component values, the application of Vto, as represented by Vref combined with the resistive voltage divider 52, 54, work to provide a tuning voltage Vc substantially equal to Vto when the DAC is set to the mid-range tuning for a particular channel. As the DAC setting is increased or decreased from mid-range, the tuning voltage Vc is offset from Vto. Further, the offset tuning range provided by the DAC is proportional to Vto providing a greater tuning range at high channels where the varactor sensitivity is less and a lower tuning range at low channels where greater voltage resolution is needed.

I claim:

1. In a tuning system including input means for receiving a plurality of RF signals corresponding to respective channels and frequency selection means for selecting one of said plurality of RF signals corresponding to a respective selected channel, apparatus comprising:

a tunable circuit coupled between said input means and an output and cooperating to control frequency characteristics of apparatus coupled between said input means and said output, said tunable circuit including a reactive element having a reactive value determined by a magnitude of an analog control signal;

means for selecting a channel;

means for providing a digital control signal in response to the frequency of said selected channel;

means for converting said digital control signal to a corresponding pulse control signal;

means for generating an analog tuning voltage having a magnitude responsive to the frequency of said selected channel;

means for scaling a version of said analog tuning voltage in response to said pulse control signal to produce a combined control signal with the value of scaling being dependent upon the duty cycle of said pulse control signal, and means for coupling said combined control signal to said tunable circuit for adjusting the tuning of said tunable circuit.

2. The apparatus of claim 1 wherein said means for providing said digital control signal includes memory means for storing digital data related to the tuning of said channels; and processor means for causing said data to be read from said memory means.

3. The apparatus of claim 1 wherein the analog tuning voltage is generated by a closed loop for generating a local oscillator signal for a conversion means, said local oscillator signal having a frequency responsive to said selected channel and being controlled by said analog tuning voltage.

4. In a tuning system including input means for receiving a plurality of RF signals corresponding to respective channels and frequency selection means for selecting one of said plurality of RF signals corresponding to a respective selected channel, apparatus for frequency selection comprising:

a tunable circuit coupled between said input means and an output and cooperating to control frequency characteristics of apparatus coupled between said input means and said output, said tunable circuit including a reactive element having a reactive value determined by magnitude of an analog control signal;

means for selecting a channel;

means for providing a digital control signal in response to the frequencies of said selected channel;

means for converting said digital control signal to a corresponding pulse control signal;

means for generating an analog tuning voltage having a magnitude responsive to the frequencies of said selected channel;

means for scaling a version of said analog tuning voltage in response to said pulse control signal to produce a combined control signal with the value of scaling being determined by the pulse control signal;

means for coupling said combined control signal to said tunable circuit for adjusting the tuning of said tunable circuit, said means for scaling including a voltage divider having a first end and a second end;

means for coupling said version of said analog tuning voltage to said first end; and means for coupling said pulse control signal to said second end.

5. Tuning apparatus, comprising:

a local oscillator signal having a frequency controlled in response to the magnitude of a tuning signal; said local oscillator being included in a closed loop which is responsive to digital data representing a desired channel;

an RF section having a filter tunable responsive to a magnitude of a tuning signal;

a memory for storing digital data corresponding to frequencies of selected channels;

means for providing a digital frequency selection signal corresponding to the stored digital data;

means for converting said digital digital frequency selection signal to a corresponding pulse signal;

means for generating an analog tuning voltage having a magnitude responsive to the frequencies of said selected channel;

a voltage divider having a first end and a second end and a point intermediate of said ends;

means for coupling said pulse signal to said first end;

means for coupling said second end to a version of the analog tuning voltage; and means coupled to said intermediate point for developing said tuning signal for tuning said tunable filter.

* * * * *